United States Patent
Kim et al.

(10) Patent No.: US 9,676,892 B2
(45) Date of Patent: Jun. 13, 2017

(54) POLYMERS FOR HARD MASKS, HARD MASK COMPOSITIONS INCLUDING THE SAME, AND METHODS FOR FORMING A PATTERN OF A SEMICONDUCTOR DEVICE USING A HARD MASK COMPOSITION

(71) Applicants: Myeong koo Kim, Suwon-si (KR); Ahreum Choi, Hanam-si (KR); Boodeuk Kim, Suwon-si (KR); Songse Yi, Seoul (KR); Jungsik Choi, Seongnam-si (KR)

(72) Inventors: Myeong koo Kim, Suwon-si (KR); Ahreum Choi, Hanam-si (KR); Boodeuk Kim, Suwon-si (KR); Songse Yi, Seoul (KR); Jungsik Choi, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/065,119

(22) Filed: Mar. 9, 2016

(65) Prior Publication Data
US 2016/0266494 A1 Sep. 15, 2016

(30) Foreign Application Priority Data
Mar. 10, 2015 (KR) .................. 10-2015-0033252

(51) Int. Cl.
*G03F 7/004* (2006.01)
*G03F 7/40* (2006.01)
(Continued)

(52) U.S. Cl.
CPC ........ *C08G 16/0256* (2013.01); *C08F 216/10* (2013.01); *C08G 12/08* (2013.01);
(Continued)

(58) Field of Classification Search
CPC . G03F 7/11; G03F 7/091; G03F 7/094; G03F 7/30; G03F 7/36; H01L 21/0274;
(Continued)

(56) References Cited

U.S. PATENT DOCUMENTS 7,737,227 B2 6/2010 Jung
7,816,067 B2 10/2010 Enomoto et al.
(Continued)

FOREIGN PATENT DOCUMENTS

JP 2012-042895 3/2012
KR 10-2013-0003059 1/2013
(Continued)

OTHER PUBLICATIONS

Komura et al. "Spin-on organic hardmask for topo-patterned substrate" *Proceedings of SPIE* (7 pages) (2012).

*Primary Examiner* — Amanda C Walke
(74) *Attorney, Agent, or Firm* — Myers Bigel, P.A.

(57) ABSTRACT

The present inventive concepts relate to a polymer for a hard mask, a hard mask composition including a polymer for a hard mask as described herein, and a method for forming a pattern of a semiconductor device using a hard mask composition as described herein. The polymer includes a structure represented by the following chemical formula 1.

[Chemical formula 1]

(Continued)

US 9,676,892 B2

Page 2

In chemical formula 1, "A", "Q", "L", "$R_1$", "$R_2$", "$R_3$", and "n" are the same as defined in the specification.

19 Claims, 5 Drawing Sheets

(51) Int. Cl.

| | |
|---|---|
| *C08G 16/02* | (2006.01) |
| *H01L 21/02* | (2006.01) |
| *C08G 12/08* | (2006.01) |
| *C08G 65/38* | (2006.01) |
| *C08G 75/14* | (2006.01) |
| *C08G 12/26* | (2006.01) |
| *G03F 7/09* | (2006.01) |
| *C08F 216/10* | (2006.01) |
| *G03F 7/30* | (2006.01) |
| *G03F 7/36* | (2006.01) |
| *H01L 21/311* | (2006.01) |
| *G03F 7/11* | (2006.01) |
| *H01L 21/033* | (2006.01) |

(52) U.S. Cl.
CPC ............ *C08G 12/26* (2013.01); *C08G 65/38* (2013.01); *C08G 75/14* (2013.01); *G03F 7/091* (2013.01); *G03F 7/094* (2013.01); *G03F 7/11* (2013.01); *G03F 7/30* (2013.01); *G03F 7/36* (2013.01); *H01L 21/02118* (2013.01); *H01L 21/02282* (2013.01); *H01L 21/0332* (2013.01); *H01L 21/0337* (2013.01); *H01L 21/31144* (2013.01)

(58) Field of Classification Search
CPC ............ H01L 21/0275; H01L 21/0276; H01L 21/31144; C08G 61/12; C08F 216/10

USPC ............ 430/270.1, 325, 322, 329, 330, 331, 430/271.1, 273.1; 438/703, 781, 694; 524/367, 325

See application file for complete search history.

(56) References Cited

U.S. PATENT DOCUMENTS

| | | | |
|---|---|---|---|
| 7,829,638 B2 | 11/2010 | Uh et al. | |
| 7,862,990 B2 | 1/2011 | Yoon et al. | |
| 8,741,539 B2 | 6/2014 | Oh et al. | |
| 9,384,977 B2* | 7/2016 | Someya | G03F 7/094 |
| 2012/0045900 A1 | 2/2012 | Watanabe et al. | |
| 2012/0178871 A1* | 7/2012 | De | G03F 7/094 |
| | | | 524/553 |
| 2012/0252218 A1 | 10/2012 | Kori et al. | |
| 2013/0337649 A1* | 12/2013 | Tachibana | G03F 7/094 |
| | | | 438/694 |
| 2014/0235059 A1* | 8/2014 | Sakamoto | C08G 12/08 |
| | | | 438/702 |
| 2015/0008212 A1 | 1/2015 | Choi et al. | |
| 2015/0184018 A1* | 7/2015 | Endo | C08G 8/02 |
| | | | 438/703 |
| 2015/0212418 A1* | 7/2015 | Nishimaki | C08G 8/04 |
| | | | 438/703 |
| 2016/0018735 A1* | 1/2016 | Tachibana | G03F 7/094 |
| | | | 430/323 |
| 2016/0027653 A1* | 1/2016 | Tachibana | G03F 7/094 |
| | | | 438/703 |

FOREIGN PATENT DOCUMENTS

| | | |
|---|---|---|
| KR | 10-2013-0026912 | 3/2013 |
| KR | 10-2013-0078429 | 7/2013 |
| KR | 10-2013-0078745 | 7/2013 |
| KR | 10-2013-0142079 | 12/2013 |
| KR | 10-2014-0038810 | 3/2014 |
| KR | 10-2014-0062604 | 5/2014 |

* cited by examiner

POLYMERS FOR HARD MASKS, HARD MASK COMPOSITIONS INCLUDING THE SAME, AND METHODS FOR FORMING A PATTERN OF A SEMICONDUCTOR DEVICE USING A HARD MASK COMPOSITION

CROSS-REFERENCE TO RELATED APPLICATION

This U.S. non-provisional patent application claims priority under 35 U.S.C. §119 to Korean Patent Application No. 10-2015-0033252, filed on Mar. 10, 2015, in the Korean Intellectual Property Office, the disclosure of which is hereby incorporated by reference in its entirety.

FIELD

The present inventive concepts relate to a polymer for a hard mask used to form a pattern of a semiconductor device, a hard mask composition including the polymer, and a method for forming a pattern of a semiconductor device using the hard mask composition.

BACKGROUND

Semiconductor devices are widely used in an electronic industry because of their small sizes, multi-functional characteristics, and/or low manufacture costs. Semiconductor devices may include memory devices storing logical data, logic devices processing operations of logical data, and hybrid devices having both the function of the memory devices and the function of the logic devices.

Semiconductor devices have been highly integrated with the development of the electronic industry. Thus, various problems (e.g., reduction of a process margin of an exposure process defining fine patterns) may be caused, so it may be more and more difficult to realize the semiconductor devices. In addition, high-speed semiconductor devices have been demanded with the development of the electronic industry.

SUMMARY

Embodiments of the present inventive concepts may provide a hard mask composition with excellent gap-fill and planarization characteristics.

Embodiments of the present inventive concepts may also provide a method for forming a pattern of a semiconductor device by means of a hard mask composition having excellent gap-fill and planarization characteristics.

In one aspect, a polymer of the present inventive concepts may include a structure represented by the following chemical formula 1.

[Chemical formula 1]

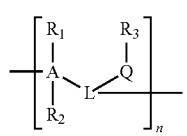

In chemical formula 1, "A" is a moiety including at least one heteroatom and at least two aromatic rings having a bonding relation with the at least one heteroatom, the at least one heteroatom is selected from a group consisting of nitrogen, oxygen, and sulfur, the at least two aromatic rings are selected from a group consisting of a substituted or unsubstituted benzene group, a substituted or unsubstituted naphthalene group, a substituted or unsubstituted anthracene group, a substituted or unsubstituted pyrene group, and any combination thereof, "Q" is a benzene group or a substituted or unsubstituted polycyclic aromatic group, "L" is used as a coupler and is a C1 to C20 alkylene group, "$R_1$" and "$R_2$" are each independently attached to one of the at least two aromatic rings and are each independently selected from a group consisting of hydrogen, a hydroxyl group, an amino group, and a C1 to C30 substituted or unsubstituted alkoxy group, "$R_3$" is hydrogen, a hydroxyl group, or a C1 to C30 substituted or unsubstituted alkoxy group, and "n" is a natural number from 1 to 10.

In some embodiments, the polymer may include a structure represented by the following chemical formula 2.

[Chemical formula 2]

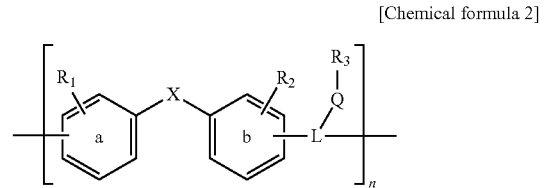

In chemical formula 2, "X" is selected from a group consisting of O, S, and NH, and "Q", "L", "$R_1$", "$R_2$", "$R_3$", and "n" are the same as defined in chemical formula 1.

In some embodiments, each of benzene ring a and benzene ring b in chemical formula 2 may independently have a condensation ring shape of one selected from a group consisting of a naphthalene ring, an anthracene ring, and a pyrene ring.

In some embodiments, the polymer may include a structure represented by any one of the following chemical formulas 2a, 2b, 2c, 2d, and 2e.

[Chemical formula 2a]

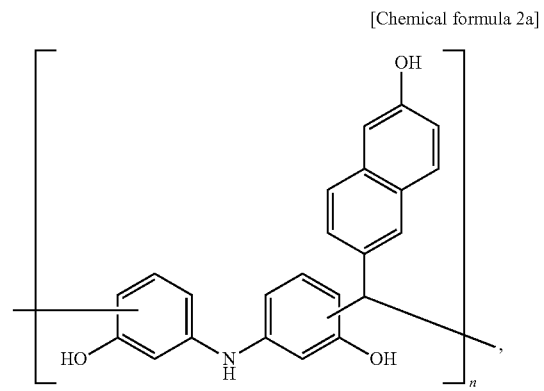

[Chemical formula 2b]

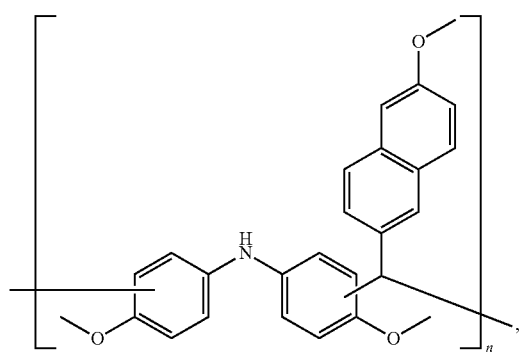

[Chemical formula 2c]

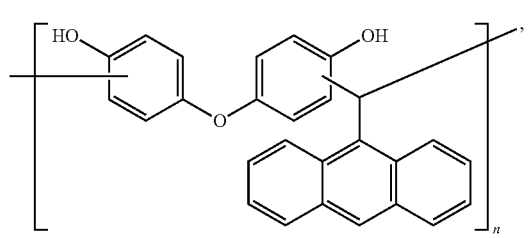

[Chemical formula 2d]

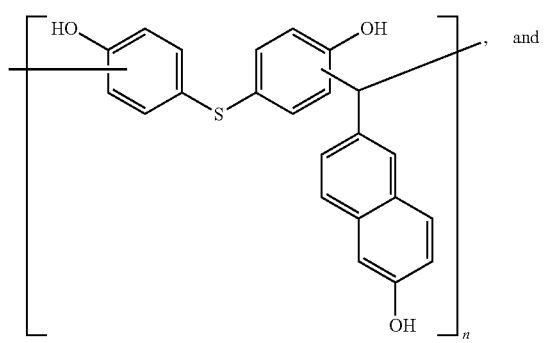

[Chemical formula 2e]

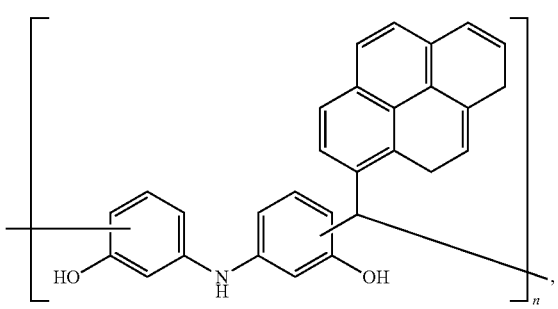

wherein "n" in chemical formulas 2a, 2b, 2c, 2d, and 2e is a natural number from 1 to 10.

In some embodiments, the polymer may include a structure represented by the following chemical formula 3.

[Chemical formula 3]

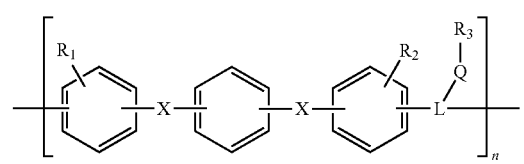

In chemical formula 3, "X" is selected from a group consisting of O, S, and NH, and "Q", "L", "R$_1$", "R$_2$", "R$_3$", and "n" are the same as defined in chemical formula 1.

In some embodiments, the polymer may include a structure represented by the following chemical formula 3a or the following chemical formula 3b.

[Chemical formula 3a]

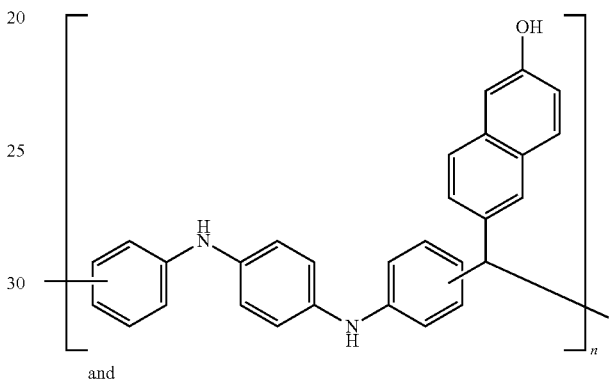

and

[Chemical formula 3b]

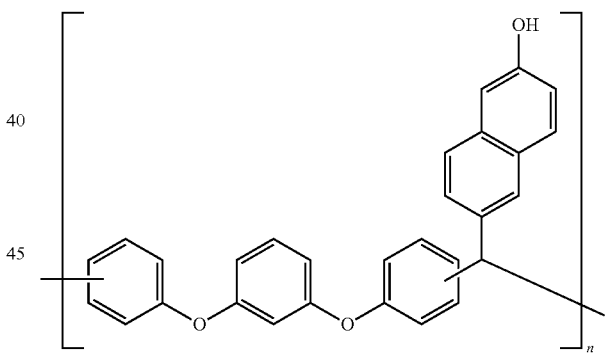

wherein "n" in chemical formulas 3a and 3b is a natural number from 1 to 10.

In some embodiments, the polymer may include a structure represented by the following chemical formula 4.

[Chemical formula 4]

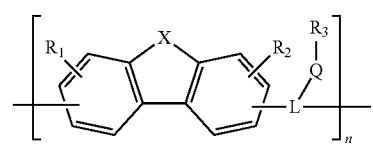

In chemical formula 4, "X" is selected from a group consisting of O, S, and NH, and "Q", "L", "R$_1$", "R$_2$", "R$_3$", and "n" are the same as defined in chemical formula 1.

In some embodiments, the polymer may include a structure represented by any one of the following chemical formulas 4a, 4b, and 4c.

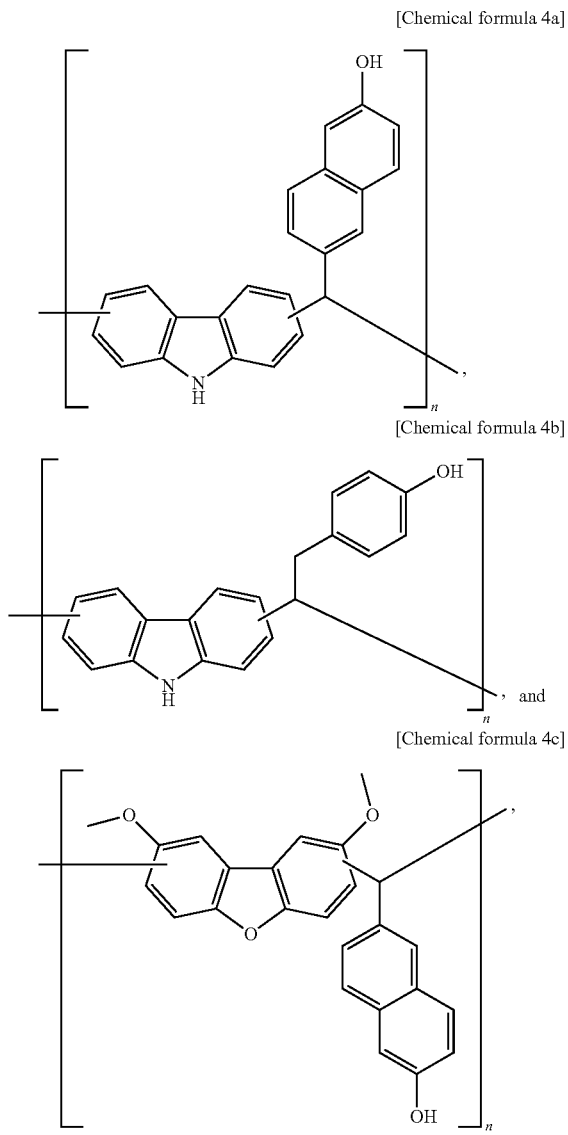

[Chemical formula 4a]

[Chemical formula 4b]

[Chemical formula 4c]

wherein "n" in chemical formulas 4a, 4b, and 4c, is a natural number from 1 to 10.

In some embodiments, the substituted or unsubstituted polycyclic aromatic group may include a naphthalene group, an anthracene group, a pyrene group, or any combination thereof.

In some embodiments, the polymer may have a weight-average molecular weight of 1,000 to 10,000.

In another aspect, a hard mask composition may include an organic solvent, and a polymer of the present inventive concepts. The polymer may include a structure represented by any one of chemical formulas 2, 3, and 4 as defined herein.

In some embodiments, each of benzene ring a and benzene ring b in chemical formula 2 may independently have a condensation ring shape of one selected from a group consisting of naphthalene, anthracene, and pyrene.

In some embodiments, the polymer may include a structure represented by one of chemical formulas 2a, 2b, 2c, 2d, and 2e as defined herein.

In some embodiments, the polymer may include a structure represented by chemical formula 3a or chemical formula 3b as defined herein.

In some embodiments, the polymer may include a structure represented by chemical formulas 4a, 4b, and 4c as defined herein.

In some embodiments, the substituted or unsubstituted polycyclic aromatic group may include a naphthalene group, an anthracene group, a pyrene group, or any combination thereof.

In some embodiments, the polymer may be present in the hard mask composition in an amount in a range of about 2 wt % to about 20 wt % with respect to a total content of the hard mask composition.

In some embodiments, the organic solvent may include at least one of a glycol ether-based solvent, an acetate-based solvent, a ketone-based solvent, a hydroxypropionate-based solvent, a cabitol-based solvent, or a lactate or lactone-based solvent.

In still another aspect, a method for forming a pattern of a semiconductor device may include forming a lower layer on a substrate, forming a hard mask layer on the lower layer using a hard mask composition as described herein, and patterning the hard mask layer to form a hard mask pattern.

In some embodiments, forming the hard mask layer may include coating the hard mask composition on the lower layer using a spin-on-coating method, and performing a bake process on the coated hard mask composition.

In some embodiments, the lower layer may include an opening, and the hard mask layer may fill the opening.

In some embodiments, patterning the hard mask layer may include forming photoresist patterns on the hard mask layer, and etching the hard mask layer using the photoresist patterns as etch masks.

In another aspect, a polymer of the present inventive concepts may include a structure represented by any one of chemical formulas 2, 3, and 4 as defined herein.

In some embodiments, the polymer may include a structure represented by any one of chemical formulas 2a, 2b, 2c, 2d, and 2e as described herein.

In some embodiments, the polymer may include a structure represented by chemical formula 3a or chemical formula 3b as defined herein.

In some embodiments, the polymer may include a structure represented by any one of chemical formulas 4a, 4b, and 4c as defined herein.

In some embodiments, the substituted or unsubstituted polycyclic aromatic group may include a naphthalene group, an anthracene group, a pyrene group, or any combination thereof.

In some embodiments, the polymer has a weight-average molecular weight of 1,000 to 10,000.

In some embodiments, the polymer may have a carbon content in a range of about 75 wt % to about 90 wt %.

In some embodiments, the carbon content of the polymer is determined after a bake process. The bake process may bake the polymer at a temperature in a range of about 100° C. to about 500° C. for a time in a range of about 10 seconds to about 10 minutes.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

DETAILED DESCRIPTION

Figure 1A:
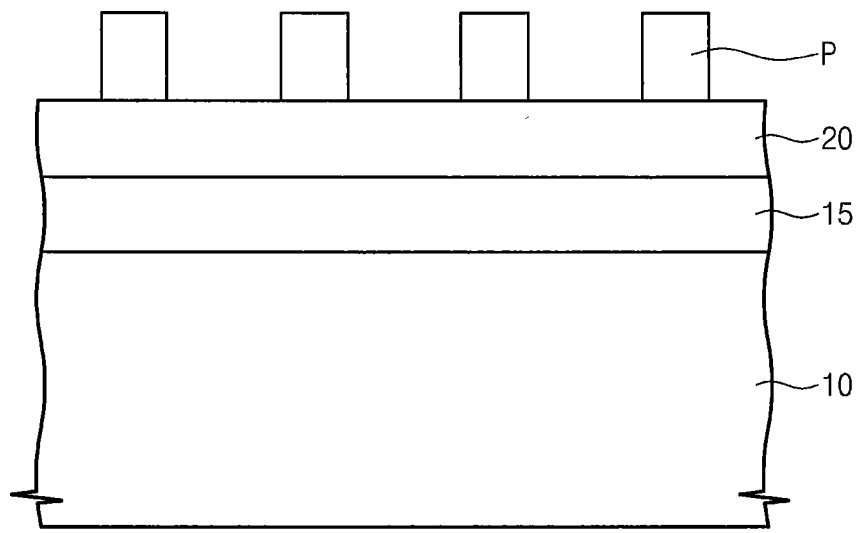
FIGS. 1A to 1H are cross-sectional views illustrating a method for forming a pattern of a semiconductor device according to example embodiments of the present inventive concepts.

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A polymer for a hard mask according to example embodiments of the present inventive concepts will be described hereinafter.

A polymer for a hard mask according to some embodiments of the present inventive concepts may include a structure represented by the following chemical formula 1.

[Chemical formula 1]

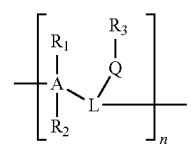

In the chemical formula 1, "A", "Q", "L", "$R_1$", "$R_2$", "$R_3$", and "n" may be defined as follows.

"A" may be a moiety that includes at least one heteroatom selected from a group consisting of nitrogen, oxygen, and sulfur, and at least two aromatic rings having a bonding relation with the at least one heteroatom. In some embodiments, the at least one heteroatom is bound and/or attached to one or more (e.g., 1, 2, 3, or more) of the at least two aromatic rings. In some embodiments, the at least one heteroatom is bound and/or attached to two of the at least two aromatic rings, such as, for example, the at least one heteroatom joins or links the at least two aromatic rings. The at least two aromatic rings are selected from a group consisting of a substituted or unsubstituted benzene group, a substituted or unsubstituted naphthalene group, a substituted or unsubstituted anthracene group, a substituted or unsubstituted pyrene group, and any combination thereof.

"Q" may be a benzene group or a substituted or unsubstituted polycyclic aromatic group. For example, the substituted or unsubstituted polycyclic aromatic group may be a naphthalene group, an anthracene group, a pyrene group, or any combination thereof.

"L" may be used as a coupler and may be a C1 to C20 alkylene group.

"$R_1$" and "$R_2$" may be independent of each other, and each of "$R_1$" and "$R_2$" may independently be hydrogen, a hydroxyl group, an amino group, or a C1 to C30 substituted or unsubstituted alkoxy group. Each of "$R_1$" and "$R_2$" may independently be combined with or attached to one of the at least two aromatic rings of "A".

"$R_3$" may be hydrogen, a hydroxyl group, or a substituted or unsubstituted C1 to C30 alkoxy group, and "n" may be a natural number from 1 to 10.

In some embodiments, the polymer for the hard mask may be obtained by polymerizing a first monomer with a second monomer at an equivalent ratio of 1:1. The first monomer may be one selected from a group consisting of a diphenylamine-based monomer, an oxydibenzene-based monomer, a diphenyl sulfide-based monomer, and a fluorine-based monomer. The second monomer may be one selected from a group consisting of a benzene-based monomer, a naphthalene-based monomer, an anthracene-based monomer, and a pyrene-based monomer. In some embodiments, the first monomer and the second monomer may be polymerized with each other at an equivalent ratio of 1:1 in the presence of a catalyst, and a resultant material generated by the polymerization may be filtered, cleaned, and dried to obtain the polymer for the hard mask.

For example, the first monomer may include one selected from a group consisting of diphenylamine, n-phenyl-2-naphthylamine, 2,2'-dinaphthylamine, n,n'-diphenyl-1,4-phenylenediamine, 3,3'-dihydroxydiphenylamine, (4-methoxy-phenyl)phenylamine, 4-methoxy-2-methyldiphenylamine, 4,4'-dimethoxydiphenylamine, diphenyl ether, 4-phenoxy phenol, 1,3-diphenoxybenzene, 4-phenoxy aniline, 4-(3-methoxyphenoxy)aniline, 4,4'-(1,3-phenylenedioxy)dianiline, phenyl sulfide, 2-(phenylthio)aniline, 2,2'-diaminophenylsulfide, carbazole, dibenzofuran, and diphenylene sulfide.

For example, the second monomer may include one selected from a group consisting of 6-hydroxy-2-naphthaldehyde, 6-methoxy-2-naphthaldehyde, benzaldehyde, 4-hydroxybenzaldehyde, anisaldehyde, 1-naphthaldehyde, 9-anthracenecarboxaldehyde, anthracene-2,3-dicarboxaldehyde, biphenyl-4-carboxaldehyde, and 1-pyrenecarboxaldehyde.

Example catalysts may include one selected from a group consisting of p-toluenesulfonic acid monohydrate, sulfuric acid, perchloric acid, phosphoric acid, p-toluenesulfonic acid, formic acid, and oxalic acid.

In some embodiments, the polymer for the hard mask may have a carbon content in a range of about 75 wt % to about 90 wt %. The carbon content of the polymer may be determined based on the total elemental content of the polymer. In some embodiments, the carbon content of the polymer may be determined after baking the polymer and/or a bake process. In some embodiments, the bake process may bake the polymer at a temperature in a range of about 100° C. to about 500° C. for a time in a range of about 10 seconds to about 10 minutes or at a temperature in a range of about 240° C. to about 400° C. for a time of about 30 seconds to about 5 minutes. In some embodiments, to show an effective characteristic (e.g., high etch selectivity) of a hard mask in a semiconductor process, the polymer for the hard mask may have a high carbon content in a range of about 75 wt % to about 90 wt %. In addition, the polymer for the hard mask may have a weight-average molecular weight in a range of about 1,000 to about 10,000 Daltons. If the weight-average molecular weight of the polymer for the hard mask is smaller than 1,000 Daltons, the coating force of the polymer may be deteriorated to cause a coating defect. Alternatively, if the weight-average molecular weight of the polymer for the hard mask is greater than 10,000 Daltons, the viscosity of a composition including the polymer for the hard mask may be high to cause a gap-fill defect during formation of a hard mask layer.

In more detail, the polymer for the hard mask may include a structure represented by one or more of the following chemical formulas 2 to 4. In some embodiments, the polymer may include a structure represented by one of the following chemical formulas 2 to 4.

[Chemical formula 2]

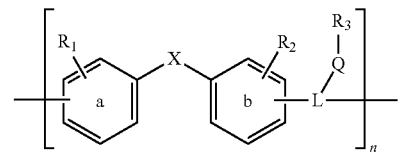

[Chemical formula 3]

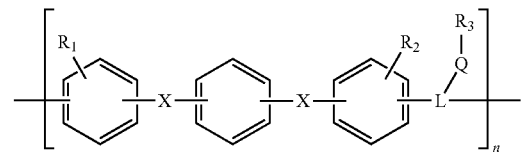

[Chemical formula 4]

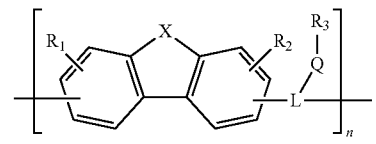

In the chemical formulas 2, 3, and 4, "X" may be one selected from a group consisting of O, S, and NH, and "Q", "L", "$R_1$", "$R_2$", "$R_3$", and "n" may be the same as defined in the chemical formula 1. In some embodiments, each of benzene ring a and benzene ring b in chemical formula 2 may independently have a condensation ring shape of one selected from a group consisting of a naphthalene ring, an anthracene ring, and a pyrene ring.

In some embodiments, if the polymer for the hard mask includes a structure represented by chemical formula 2, the polymer may include a structure selected from a group consisting of, for example, those represented by the following chemical formulas 2a to 2e.

[Chemical formula 2a]

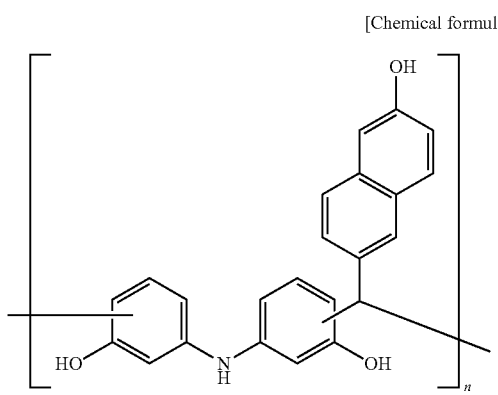

[Chemical formula 2b]

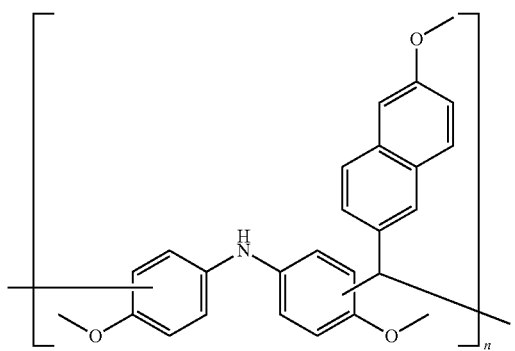

[Chemical formula 2c]

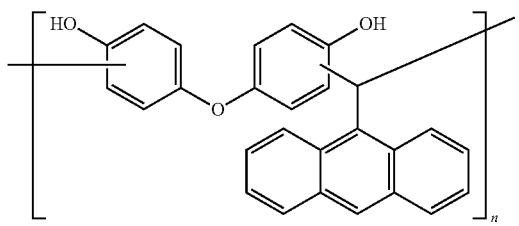

[Chemical formula 2d]

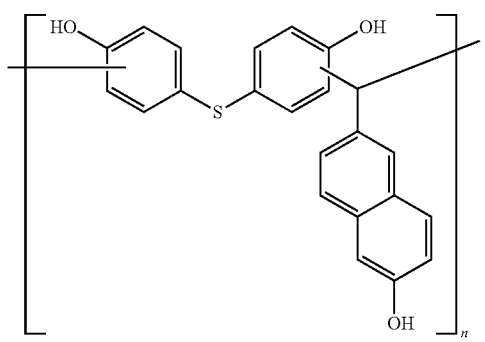

[Chemical formula 2e]

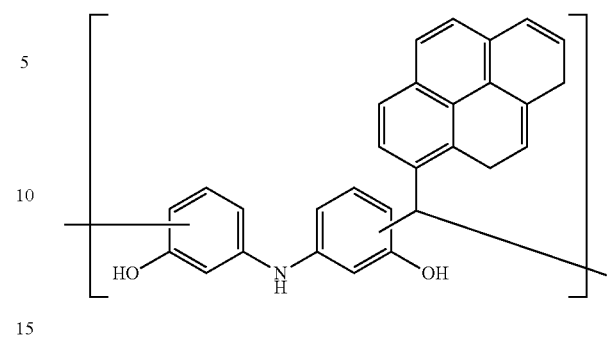

In each of chemical formulas 2a to 2e, "n" is a natural number from 1 to 10.

In some embodiments, if the polymer for the hard mask includes a structure represented by the chemical formula 3, the polymer may include, for example, a structure represented by the following chemical formula 3a and/or the following chemical formula 3b.

[Chemical formula 3a]

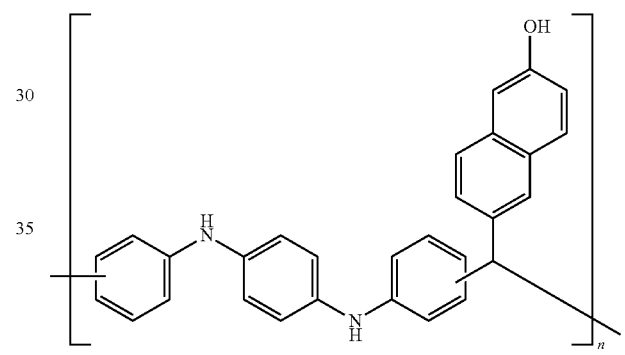

[Chemical formula 3b]

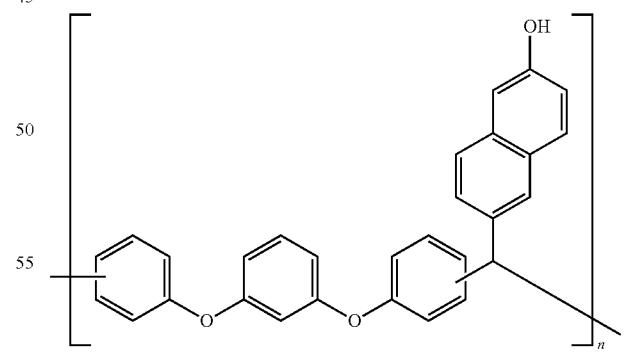

In each of chemical formulas 3a and 3b, "n" is a natural number from 1 to 10.

In some embodiments, if the polymer for the hard mask includes a structure represented by chemical formula 4, the polymer may include a structure selected from a group consisting of, for example, those represented by the following chemical formulas 4a to 4c.

[Chemical formula 4a]

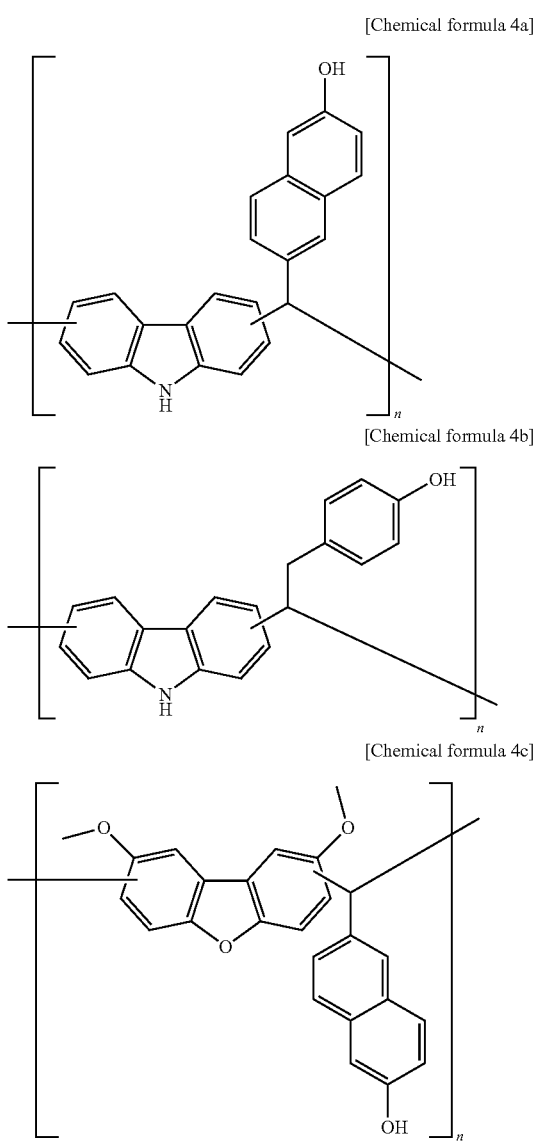

[Chemical formula 4b]

[Chemical formula 4c]

In each of chemical formulas 4a to 4c, "n" is a natural number from 1 to 10.

Hereinafter, a hard mask composition according to example embodiments of the present inventive concepts will be described.

The hard mask composition according to example embodiments of the present inventive concepts may include a polymer for a hard mask, as described herein, and an organic solvent.

The polymer for the hard mask composition may be the same as described herein. For example, in some embodiments, the polymer for the hard mask composition may include a structure represented by chemical formula 1. In some embodiments, the polymer for the hard mask may include a structure represented by chemical formula(s) 2, 3, and/or 4. In some embodiments, if the polymer for the hard mask includes a structure represented by chemical formula 2, the polymer may include, for example, a structure represented chemical formula(s) 2a, 2b, 2c, 2d, and/or 2e. In some embodiments, if the polymer for the hard mask includes a structure represented by chemical formula 3, the polymer may include, for example, a structure represented by chemical formula 3a and/or chemical formula 3b. In some embodiments, if the polymer for the hard mask includes a structure represented by chemical formula 4, the polymer may include, for example, a structure represented by chemical formula(s) 4a, 4b, and/or 4c.

The organic solvent may include a material having sufficient solubility and dispersibility with respect to the polymer for the hard mask. In some embodiments, the organic solvent may include at least one of a glycol ether-based solvent, an acetate-based solvent, a ketone-based solvent, a hydroxypropionate-based solvent, a cabitol-based solvent, or a lactate or lactone-based solvent. The glycol ether-based solvent may include, for example, ethyleneglycol monomethyl ether, ethyleneglycol monoethyl ether, ethyleneglycol monopropyl ether, or ethyleneglycol ethyl methyl ether. The acetate-based solvent may include, for example, methylcellosolve acetate, ethylcellosolve acetate, propyleneglycol monomethyl ether acetate, propyleneglycol monoethyl ether acetate, or propyleneglycol monopropyl ether acetate. The ketone-based solvent may include, for example, methyl isopropyl ketone, cyclohexanone, or 2-heptanone. The hydroxypropionate-based solvent may include methyl-2-hydroxypropionate or ethyl-2-hydroxypropionate. The cabitol-based solvent may include, for example, methyl cabitol, ethyl cabitol, or propyl cabitol. The lactate or lactone-based solvent may include ethyl lactate or gamma-butyrolactone.

One or more (e.g., 1, 2, 3, 4, 5, or more) organic solvents may be present in a hard mask composition of the present inventive concepts. In some embodiments, an organic solvent may be used individually. In some embodiments, at least two different organic solvents may be mixed with each other and used. The content of the organic solvent may be suitably adjusted depending on the physical properties (e.g., volatility and/or viscosity) of the organic solvent.

In some embodiments, the polymer for the hard mask may be present in a hard mask composition in an amount in a range of about 2 wt % to about 20 wt % with respect to a total content of the hard mask composition. If the polymer for the hard mask is present at an amount less than 2 wt %, it may be difficult to form a hard mask layer having a desired thickness. If the polymer for the hard mask is present at an amount greater than 20 wt %, a solubility of the polymer for the hard mask may be a problem (for example, the solubility may exceed a limit), and a gap-fill defect may be caused by an increase in viscosity of the hard mask composition during formation of a hard mask layer filling an opening.

The hard mask composition may further include a hardener. The hardener may be present in a hard mask composition in an amount in a range of about 0.2 wt % to about 5 wt % with respect to the total content of the hard mask composition.

In some embodiments, the hardener may include at least one of a monomer or polymer having a hydroxyphenyl group, a polyol-based monomer or polymer for which at least two glycidyl groups are substituted, a multi-functional monomer for which the number of ethylenically unsaturated functional groups is in a range of 2 to 6, a melamine monomer or polymer, or tetramethoxymethylglycouril.

Example monomers or polymers having the hydroxyphenyl group may include, but are not limited to, bisphenol A, 1,1,1-tris(4-hydroxyphenyl)ethane, or polyhydroxystyrene. Example polyol-based monomers or polymers for which at least two glycidyl groups are substituted may include, but are not limited to, bisphenol A diglycidyl ether, bisphenol A propoxylate diglycidyl ether, or triphenylolmethane triglycidyl ether. Example multi-functional monomers for which the number of the ethylenically unsaturated functional groups is in a range of 2 to 6 may include, but are not limited to, 1,6-hexanediol diacrylate, 1,6-hexanediokethoxylated) diacrylate, 1,4-butanediol diacrylate, hydroxy pivalicacid neopentyl glycol diacrylate, neopentyl glycol diacrylate, tripropylene glycol diacrylate, dipropylene glycol diacrylate, tricyclodecane dimethanol diacrylate, tetraethylene glycol diacrylate, trimethylol propane triacrylate, trimethylol propane ethoxylated triacrylate, glycerin propoxylated triacrylate, pentaerythritol triacrylate, di(trimethylol propane) tetraacrylate, pentaerythritol tetraacrylate, pentaerythritol propoxylated triacrylate, dipentaerythritol pentaacrylate, dipentaerythritol hexaacrylate, pentaerythritol ethoxylated tetraacrylate, 1,4-butanol dimethacrylate, 1,6-hexanediol dimethacrylate, ethyleneglycol dimethacrylate, diethyleneglycol dimethacrylate, triethyleneglycol dimethacrylate, alkoxylated dimethacrylate, trimethylol propane trimethacrylate, bisphenol A epoxy diacrylate, bisphenolA epoxy dimethacrylate, tetra-functional polyester acrylate, hexa-functional polyester acrylate, chlorinated polyester acrylate, di-functional polyurethane acrylate, tri-functional polyurethane acrylate, or hexa-functional polyurethane acrylate.

In some embodiments, the hardener may further include an isocyanate-based hardener, a peroxide-based hardener, an epoxy-based hardener, or an amine-based hardener.

The hard mask composition may further include a catalyst for hardening. The catalyst for hardening may be present in a hard mask composition in an amount in a range of about 0.01 wt % to about 2 wt % with respect to the total content of the hard mask composition.

According to some embodiments, the catalyst for hardening may include at least one of an organic acid, an acid generator, a radical initiator, or an aminoplaste compound. Here, the acid generator may correspond to a compound that generates an acid by heat or light according to characteristics of a compound. The acid generator may include iodonium salts, sulfonium salts, phosphonium salts, deazonium salts, pyridinium salts, sec-alkyl-toluene sulfonate, and/or amides.

In some embodiments, a hardener and/or a catalyst for hardening may not be included in a hard mask composition. In some embodiments, a hardener or a catalyst for hardening may be included in a hard mask composition. In some embodiments, both a hardener and a catalyst for hardening may be included in a hard mask composition.

As described herein, the polymer for the hard mask may include at least one heteroatom selected from the group consisting of nitrogen, oxygen, and sulfur and at least two aromatic rings combined with and/or bound to the at least one heteroatom, and thus, the polymer may have a flexible three-dimensional structure. This means that fluidity and heat-resistance of the polymer for the hard mask may be improved. In addition, since the polymer for the hard mask includes at least one benzene group or the polycyclic aromatic group bonded to its substituent, a mechanical characteristic of the polymer for the hard mask may also be improved. As a result, the hard mask composition including the polymer for the hard mask may have excellent gap-fill and planarization characteristics.

A method for forming a pattern of a semiconductor device using a hard mask composition as described herein will be described hereinafter.

FIGS. 1A to 1H are cross-sectional views illustrating a method for forming a pattern of a semiconductor device according to example embodiments of the present inventive concepts.

Referring to FIG. 1A, a lower layer 15 and a first mask layer 20 may be sequentially formed on a substrate 10. The substrate 10 may include a semiconductor material. In this case, the substrate 10 may be a semiconductor substrate or an epitaxial layer. For example, the substrate 10 may include at least one of crystalline silicon, amorphous silicon, silicon doped with dopants, or silicon-germanium.

In some embodiments, the lower layer 15 may be formed of a semiconductor material, a conductive material, an insulating material, or any combination thereof. For example, if the lower layer 15 is formed of the semiconductor material, the lower layer 15 may be a semiconductor substrate or an epitaxial layer. If the lower layer 15 is formed of the conductive material, the lower layer 15 may be formed of, for example, doped poly-silicon, a metal silicide, a metal, a metal nitride, or any combination thereof. If the lower layer 15 is formed of the insulating material, the lower layer 15 may be formed of at least one of silicon oxide, silicon nitride, silicon oxynitride, or a low-k material having a dielectric constant lower than that of silicon oxide. In addition, the lower layer 15 may be formed of at least one of crystalline silicon, amorphous silicon, silicon doped with dopants, silicon-germanium, or a carbon-based material. Furthermore, the lower layer 15 may be formed of a single layer or a plurality of stacked layers. For example, the lower layer 15 may include a plurality of stacked insulating layers. In some embodiments, the stacked layers of the lower layer 15 may have an etch selectivity with respect to each other. The lower layer 15 may be formed using a chemical vapor deposition (CVD) method and/or an atomic layer deposition (ALD) method.

The first mask layer 20 may be formed using a hard mask composition as described herein. In other words, the hard mask composition according to some embodiments of the present inventive concepts may be applied or coated onto the lower layer 15, and then, a bake process may be performed on the hard mask composition to form the first mask layer 20. The hard mask composition may be applied using a spin-on-coating method. In some embodiments, the bake process may be performed at a temperature in a range of about 240° C. to about 400° C. for a time of about 30 seconds to about 5 minutes.

Next, photoresist patterns P may be formed on the first mask layer 20. A photoresist material may be coated on the first mask layer 20 to form a photoresist layer, an exposure process and a development process may be performed on the photoresist layer to form the photoresist patterns P. In some embodiments, the photoresist patterns P may have a line-and-space structure.

Even though not shown in the drawings, an anti-reflection layer (not shown) may be formed between the first mask layer 20 and the photoresist patterns P. The anti-reflection layer may be formed of an organic material, a compound, or any combination thereof. According to some embodiments, the anti-reflection layer may be formed of an organic material having an etch characteristic similar to that of a photoresist. According to other embodiments, the anti-reflection layer may include a silicon oxynitride layer and the above mentioned organic material layer, and may be stacked.

Figure 1B:
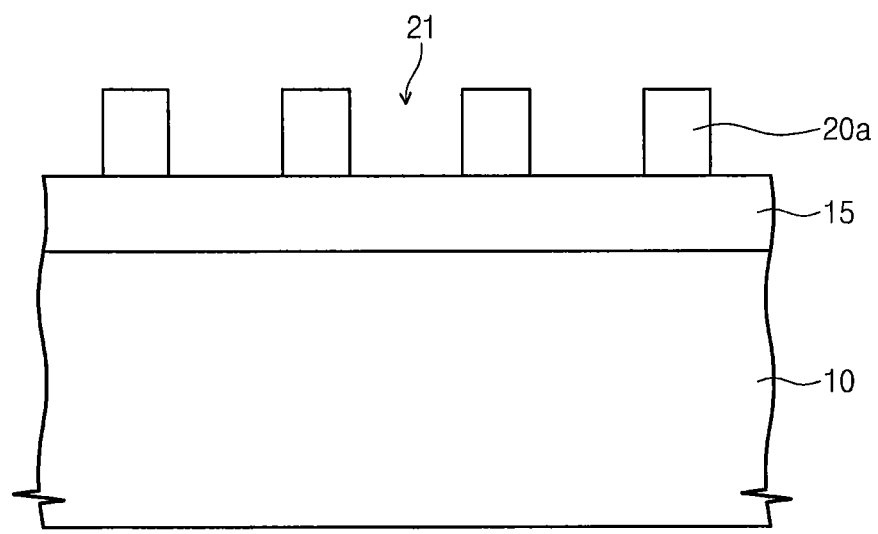

Referring to FIG. 1B, the first mask layer 20 may be etched using the photoresist patterns P as etch masks to form first mask patterns 20a exposing the lower layer 15. The first mask patterns 20a may have substantially the same planar shapes as the photoresist patterns P. In some embodiments, the first mask patterns 20a may have a line-and-space structure. Thus, a first opening 21 may be defined by sidewalls, facing each other, of the first mask patterns 20a adjacent to each other.

Figure 1C:
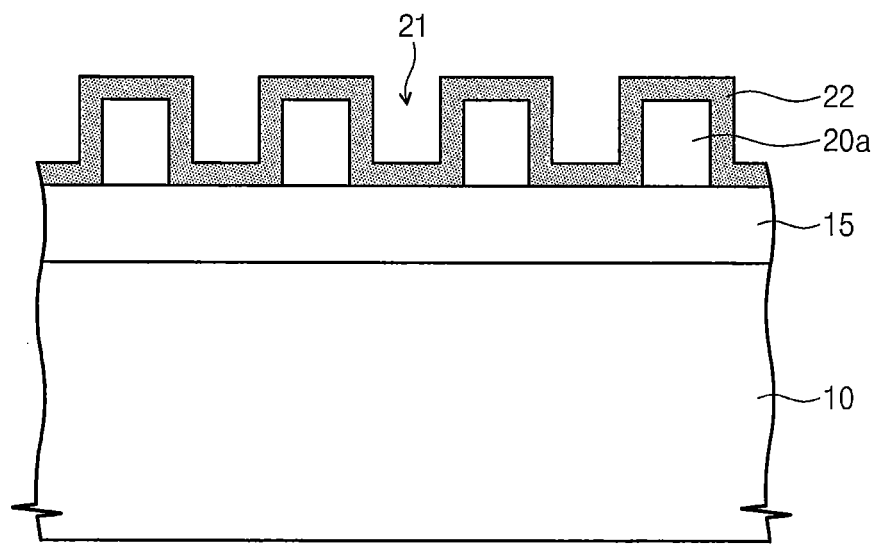

Referring to FIG. 1C, a sacrificial layer 22 may be conformally formed on the substrate 10. The sacrificial layer 22 may cover the sidewalls and top surfaces of the first mask patterns 20a and may extend onto the exposed top surface of the lower layer 15 (e.g., bottom surfaces of the first openings 21). In some embodiments, the sacrificial layer 22 may not completely fill the first openings 21. In some embodiments, a sum of thicknesses of the sacrificial layer 22 deposited on both sidewalls of the first opening 21 may be smaller than a half of a width of the first opening 21. The sacrificial layer 22 may be formed using an ALD method. The sacrificial layer 22 may be formed of, for example, a silicon oxide layer.

Figure 1D:
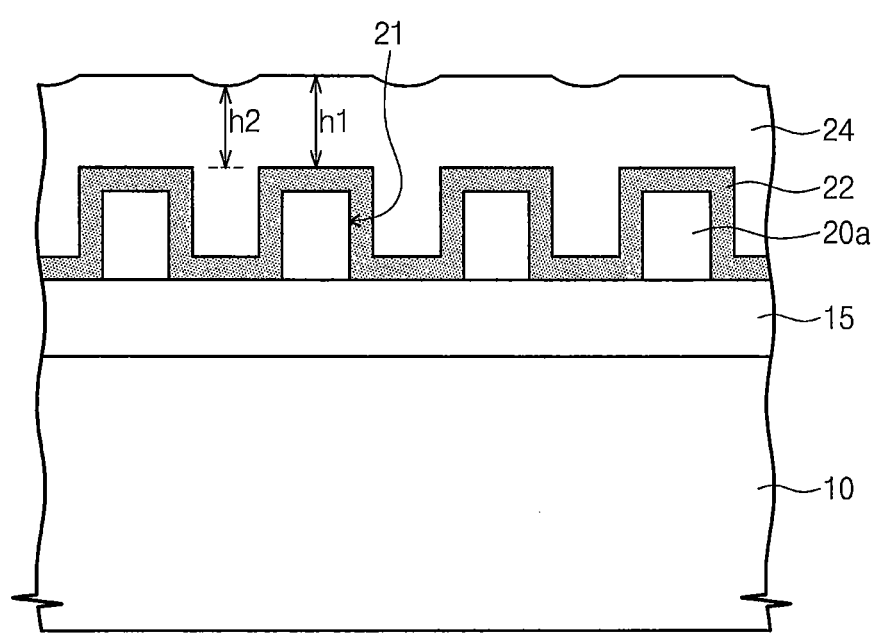

Referring to FIG. 1D, a second mask layer 24 may be formed on the sacrificial layer 22. The second mask layer 24 may be formed to completely fill the first openings 21 in which the sacrificial layer 22 is formed. The second mask layer 24 may be formed using a hard mask composition as described herein. In other words, the hard mask composition according to some embodiments of the present inventive concepts may be coated onto the sacrificial layer 22, and a bake process may be performed on the hard mask composition to form the second mask layer 24. The hard mask composition may be coated using a spin-on-coating method. For example, the bake process may be performed at a temperature in a range of about 100° C. to about 500° C. for a time in a range of about 10 seconds to about 10 minutes. Since the second mask layer 24 is formed to fill the first openings 21 having the sacrificial layer 22, the second mask layer 24 may have a top surface having a level difference. In more detail, the second mask layer 24 may include a first portion having a top surface of a first height h1, and a second portion having a top surface of a second height h2. Here, each of, the first and second heights h1 and h2 may be defined as a vertical distance from the topmost surface of the sacrificial layer 22 to the top surface of each of the first and second portions of the second mask layer 24. According to the present inventive concepts, the second mask layer 24 may be formed using a hard mask composition according to embodiments of the present inventive concepts, and thus, the level difference (i.e., a distance between the first and second heights h1 and h2, h1–h2) may be minimized.

Figure 1E:
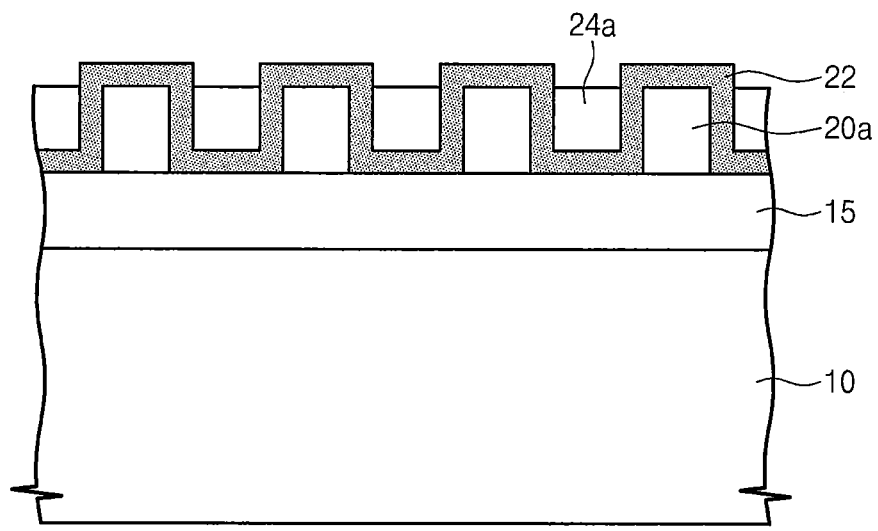

Referring to FIG. 1E, a portion of the second mask layer 24 may be removed to expose the top surface of the sacrificial layer 22, so second mask patterns 24a may be formed. The second mask patterns 24a may be locally formed in the first openings 21, respectively. In some embodiments, the second mask patterns 24a may have line shapes that extend along the first mask patterns 20a in one direction. When viewed from a plan view, the first mask patterns 20a and the second mask patterns 24a may be alternately arranged and the sacrificial layer 22 may be disposed between the first mask patterns 20a and the second mask patterns 24a. The top surface of the sacrificial layer 22 may be exposed between the second mask patterns 24a adjacent to each other. The second mask patterns 24a may be formed in such a way that top surfaces of the second mask patterns 24a are disposed at substantially the same height as the top surfaces of the first mask patterns 20a.

The portion of the second mask layer 24 may be removed using a dry etch-back process. Since the second mask layer 24 is formed to have the top surface having the minimized level difference, it is possible to improve a process margin of the etching process removing the portion of the second mask layer 24.

Figure 1F:
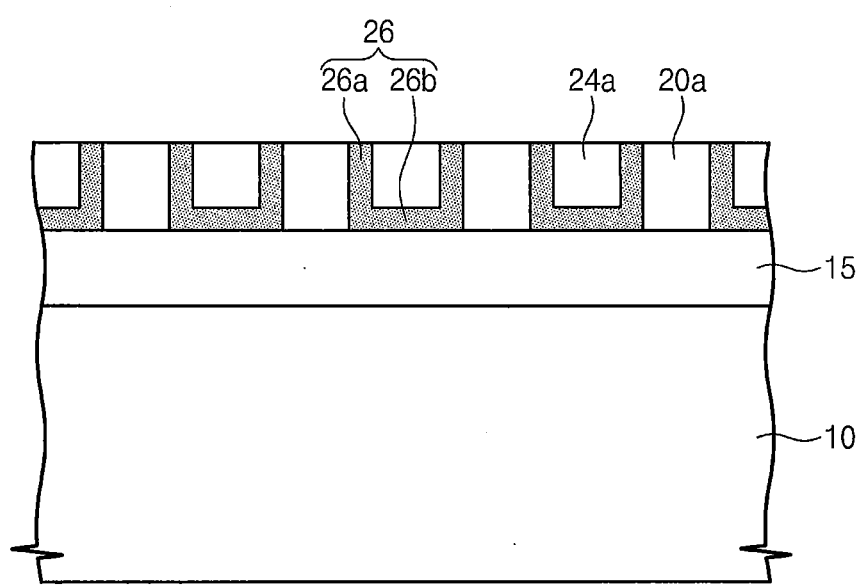

Referring to FIG. 1F, portions of the sacrificial layer 22 which cover the top surfaces of the first mask patterns 20a may be removed to expose the top surfaces of the first mask patterns 20a. At the same time, sacrificial patterns 26 may be formed between the first mask patterns 20a and the second mask patterns 24a. Each of the sacrificial patterns 26 may include a pair of vertical portions 26a disposed on opposite sidewalls of the second mask pattern 24a corresponding thereto, and a bottom b disposed between the second mask pattern 24a and the lower layer 15. The bottom portion 26b may be connected between bottom ends of the pair of vertical portions 26a.

Figure 1G:
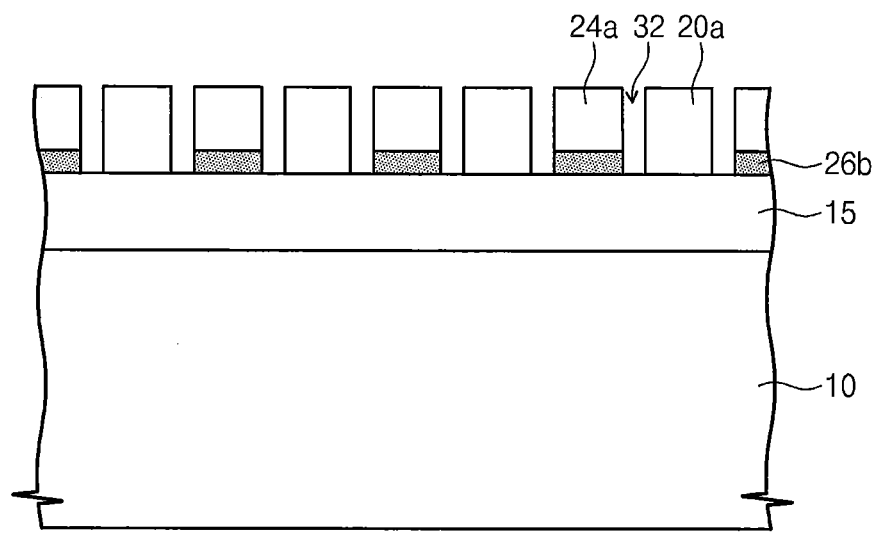

Referring to FIG. 1G, the vertical portions 26a of the sacrificial patterns 26 may be selectively removed to form second openings 32 between the first mask patterns 20a and the second mask patterns 24a. Meanwhile, the vertical portions 26a of the sacrificial patterns 26 may be selectively removed, so the bottom portions 26b of the sacrificial patterns 26 may remain under the second mask patterns 24a.

Figure 1H:
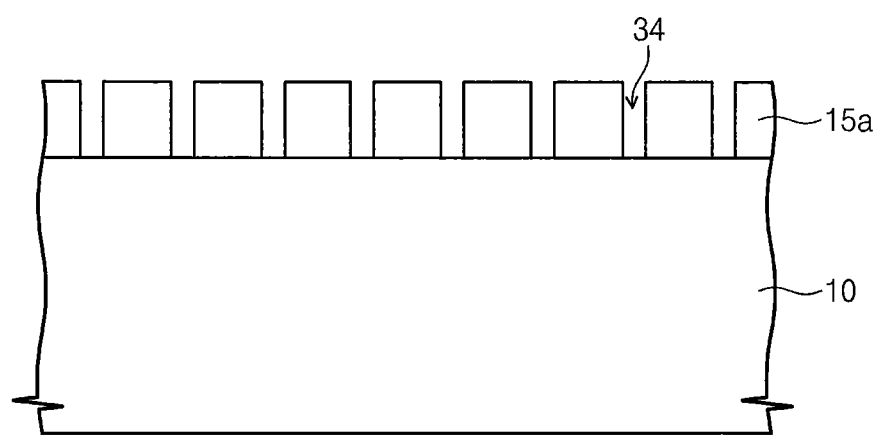

Referring to FIG. 1H, the lower layer 15 may be etched using the first and second mask patterns 20a and 24a of FIG. 1G as etch masks to form a lower pattern 15a. The lower pattern 15a may include third openings 34 exposing the substrate 10. The third openings 34 may have trench shapes extending in one direction. During the etching process of the lower layer 15, the first and second mask patterns 20a and 24a may also be etched and removed. Even though not shown in the drawings, the substrate 10 may be etched using the lower pattern 15a as an etch mask, so an upper portion of the substrate 10 may be recessed. In addition, the recessed regions of the substrate 10 may be filled with a conductive material.

As described herein, a hard mask composition according to some embodiments of the present inventive concepts may be used as a hard mask layer formed under a photoresist layer and/or a hard mask layer filling an opening.

Hereinafter, the present inventive concepts will be described in more detail through embodiment examples. However, the present inventive concepts are not limited to the following embodiment examples, and the following embodiment examples are provided only to disclose the present inventive concepts and let those skilled in the art know the category of the present inventive concepts.

SYNTHESIS EXAMPLES

Synthesis Example 1—Polymerization of 3,3'-dihydroxydiphenylamine and 6-hydroxy-2-naphthaldehyde Dioxane 40 g was provided into a flask, and 3,3'-dihydroxydiphenylamine 10 g (49.69 mmol) and 6-hydroxy-2-naphthaldehyde 8.57 g (49.79 mmol) were added into the flask and were dissolved in the dioxane by stirring the mixture. Thereafter, after p-toluenesulfonic acid monohydrate 1.04 g (5.47 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 2a.

[Chemical formula 2a]

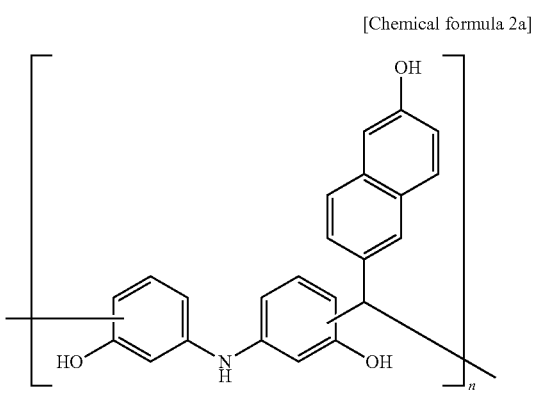

A weight-average molecular weight of the polymer was 3700, and a carbon content of the polymer was 78 wt %.

Synthesis Example 2—Polymerization of n,n'-diphenyl-1,4-phenylenediamine and 6-hydroxy-2-naphthaldehyde Dioxane 40 g was provided into a flask, and n,n'-diphenyl-1,4-phenylenediamine 10 g (38.41 mmol) and 6-hydroxy-2-naphthaldehyde 6.63 g (38.51 mmol) were added into the flask and were dissolved in the dioxane by stirring the mixture. Thereafter, after p-toluenesulfonic acid monohydrate 0.80 g (4.23 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 2b.

[Chemical formula 2b]

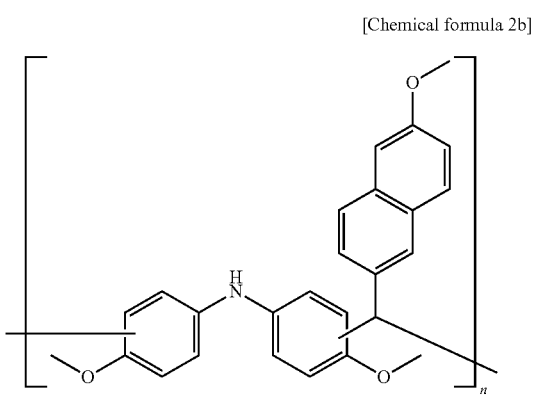

A weight-average molecular weight of the polymer was 2900, and a carbon content of the polymer was 84 wt %.

Synthesis Example 3—Polymerization of 4-4'-dihydroxydiphenylether and 9-anthracenecarboxaldehyde Dioxane 40 g was provided into a flask, and 4-4'-dihydroxydiphenylether 10 g (49.45 mmol) and 9-anthracenecarboxaldehyde 10.22 g (49.55 mmol) were added into the flask and were dissolved in the dioxane by stirring the mixture. Thereafter, after p-toluenesulfonic acid monohydrate 1.03 g (5.44 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 2c.

[Chemical formula 2c]

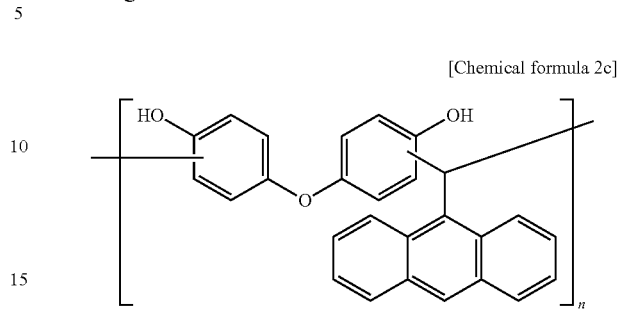

A weight-average molecular weight of the polymer was 3500, and a carbon content of the polymer was 83 wt %.

Synthesis Example 4—Polymerization of 4,4'-thioldiphenol and 6-hydroxy-2-naphthaldehyde Dioxane 40 g was provided into a flask, and 4,4'-thioldiphenol 10 g (45.81 mmol) and 6-hydroxy-2-naphthaldehyde 7.9 g (45.91 mmol) were added into the flask and were dissolved in the dioxane by stirring the mixture. Thereafter, after p-toluenesulfonic acid monohydrate 0.96 g (5.04 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 2d.

[Chemical formula 2d]

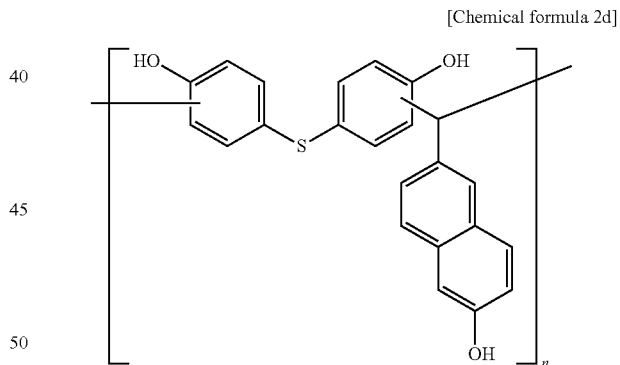

A weight-average molecular weight of the polymer was 3600, and a carbon content of the polymer was 75 wt %.

Synthesis Example 5—Polymerization of 3,3'-dihydroxydiphenylamine and 1-pyrenecarboxaldehyde Dioxane 40 g was provided into a flask, and 3,3'-dihydroxydiphenylamine 10 g (49.70 mmol) and 1-pyrenecarboxaldehyde 11.44 g (49.80 mmol) were added into the flask and were dissolved in the dioxane by stirring the mixture. Thereafter, after p-toluenesulfonic acid monohydrate 1.06 g (5.55 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 2e.

[Chemical formula 2e]

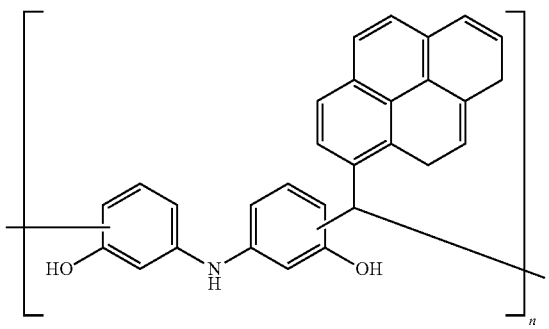

A weight-average molecular weight of the polymer was 3600, and a carbon content of the polymer was 84 wt %.

Synthesis Example 6—Polymerization of 4,4'-dimethoxydiphenylamine and 6-methoxy-2-naphthaldehyde Dioxane 40 g was provided into a flask, and 4,4'-dimethoxydiphenylamine 10 g (43.62 mmol) and 6-methoxy-2-naphthaldehyde 8.14 g (43.72 mmol) were added into the flask and were dissolved in the dioxane by stirring the mixture. Thereafter, after p-toluenesulfonic acid monohydrate 0.91 g (4.80 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 3a.

[Chemical formula 3a]

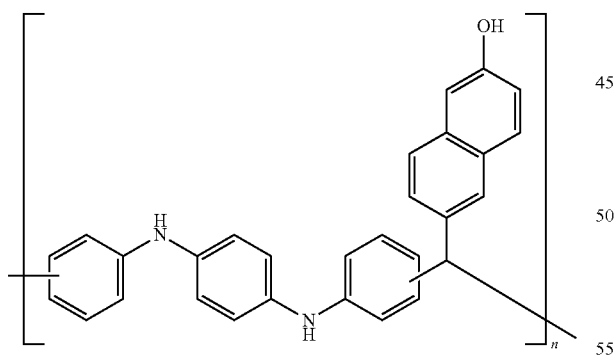

A weight-average molecular weight of the polymer was 2400, and a carbon content of the polymer was 79 wt %.

Synthesis Example 7—Polymerization of 1,3-diphenoxybenzene and 6-hydroxy-2-naphthaldehyde Dioxane 40 g was provided into a flask, and 1,3-diphenoxybenzene 10 g (38.12 mmol) and 6-hydroxy-2-naphthaldehyde 6.56 g (38.22 mmol) were added into the flask and were dissolved in the dioxane by stirring the mixture. Thereafter, after p-toluenesulfonic acid monohydrate 0.80 g (4.19 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 3b.

[Chemical formula 3b]

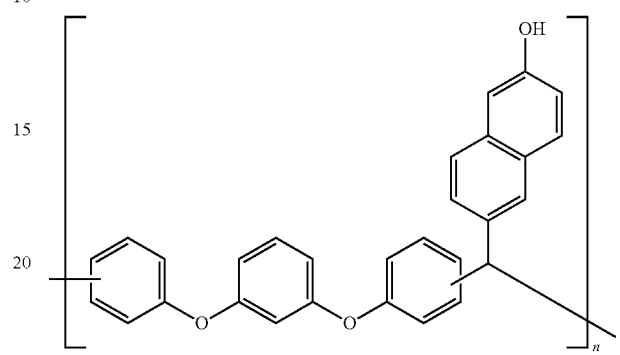

A weight-average molecular weight of the polymer was 3200, and a carbon content of the polymer was 84 wt %.

Synthesis Example 8—Polymerization of carbazole and 6-hydroxy-2-naphthaldehyde

Dioxane 40 g was provided into a flask, and carbazole 10 g (59.81 mmol) and 6-hydroxy-2-naphthaldehyde 10.32 g (59.91 mmol) were added into the flask and were dissolved in the dioxane by stirring the mixture. Thereafter, after p-toluenesulfonic acid monohydrate 1.14 g (5.98 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 4a.

[Chemical formula 4a]

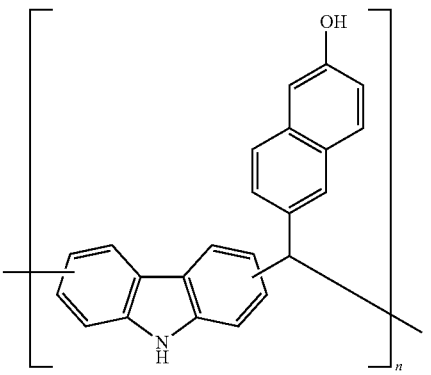

A weight-average molecular weight of the polymer was 3000, and a carbon content of the polymer was 85 wt %.

Synthesis Example 9—Polymerization of carbazole and 2-(4-hydroxyphenyl)acetaldehyde Dioxane 40 g was provided into a flask, and carbazole 10 g (59.81 mmol) and 2-(4-hydroxyphenyl)acetaldehyde 8.14 g (59.91 mmol) were added into the flask and were dissolved in the dioxane by stirring the mixture. Thereafter, after p-toluenesulfonic acid monohydrate 1.25 g (6.58 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 4b.

[Chemical formula 4b]

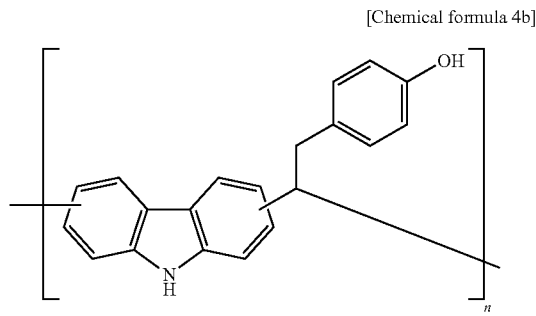

A weight-average molecular weight of the polymer was 3200, and a carbon content of the polymer was 84 wt %.

Synthesis Example 10—Polymerization of 2,8-dimethoxydibenzofuran and 6-hydroxy-2-naphthaldehyde Dioxane 40 g was provided into a flask, and 2,8-dimethoxydibenzofuran 10 g (43.81 mmol) and 6-hydroxy-2-naphthaldehyde 7.56 g (43.91 mmol) were added into the flask and were dissolved in the dioxane by stirring the mixture. Thereafter, after p-toluenesulfonic acid monohydrate 0.92 g (4.82 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 4c.

[Chemical formula 4c]

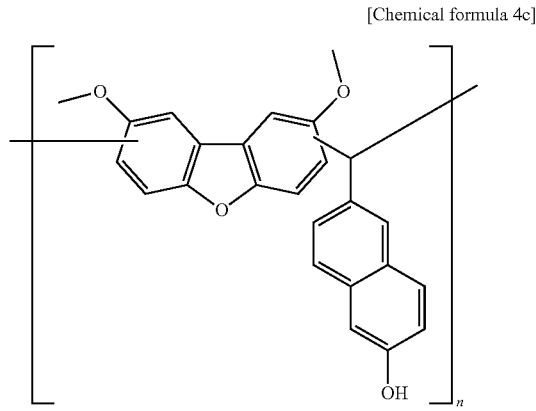

A weight-average molecular weight of the polymer was 4000, and a carbon content of the polymer was 79 wt %.

Comparison Synthesis Example 1—Polymerization of 1-hydroxypyrene and 1-naphthaldehyde Dioxane 40 g was provided into a flask, and 1-hydroxypyrene 10 g (45.82 mmol) and 1-naphthaldehyde 7.17 g (45.92 mmol) were added into the flask and were dissolved in the dioxane by stirring the mixture. Thereafter, after p-toluenesulfonic acid monohydrate 0.96 g (5.04 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 5a.

[Chemical formula 5a]

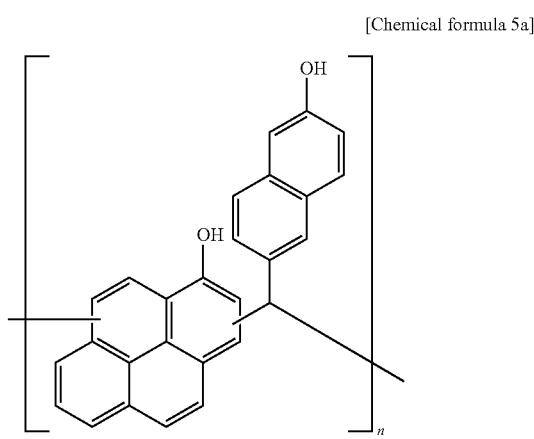

A weight-average molecular weight of the polymer was 5600, and a carbon content of the polymer was 91 wt %.

Comparison Synthesis Example 2—Polymerization of 1-hydroxypyrene and 9-anthracenecarboxaldehyde Dioxane 40 g was provided into a flask, and 1-hydroxypyrene 10 g (45.82 mmol) and 9-anthracenecarboxaldehyde 9.47 g (45.92 mmol) were added into the flask and were dissolved in the dioxane by stirring the mixture. Thereafter, after p-toluenesulfonic acid monohydrate 0.96 g (5.04 mmol) was added, a generated solution was heated to 100° C. and was stirred for 12 hours. After completion of the reaction, the solution was precipitated in methanol to form a deposit. The formed deposit was filtered and then dried in an oven at 60° C. to obtain a polymer represented by the following chemical formula 5b.

[Chemical formula 5b]

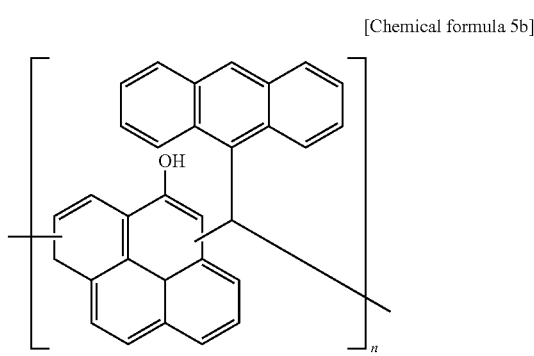

A weight-average molecular weight of the polymer was 3600, and a carbon content of the polymer was 92 wt %.

COMPOSITION EXAMPLES

Embodiment Example 1

The polymer (20 g) obtained using the synthesis described in synthesis example 1, bisphenol A (1 g) used as the hardener, and pyridinium para-toluenesulfonate (0.1 g) used as the catalyst for hardening were dissolved in propylene glycol monomethyl ether acetate (78.9 g) used as the solvent, and the obtained solution was filtered through a filter having a pore size of 0.05 μm to prepare a hard mask composition.

Embodiment Example 2

A hard mask composition was prepared by the same method as embodiment example 1 except that the polymer obtained using the synthesis described in synthesis example 2 was used instead of the polymer of synthesis example 1.

Embodiment Example 3

A hard mask composition was prepared by the same method as embodiment example 1 except that the polymer obtained using the synthesis described in synthesis example 3 was used instead of the polymer of synthesis example 1.

Embodiment Example 4

A hard mask composition was prepared by the same method as embodiment example 1 except that the polymer obtained using the synthesis described in synthesis example 4 was used instead of the polymer of synthesis example 1.

Embodiment Example 5

A hard mask composition was prepared by the same method as embodiment example 1 except that the polymer obtained using the synthesis described in synthesis example 5 was used instead of the polymer of synthesis example 1.

Embodiment Example 6

A hard mask composition was prepared by the same method as embodiment example 1 except that the polymer obtained using the synthesis described in synthesis example 6 was used instead of the polymer of the synthesis example 1.

Embodiment Example 7

A hard mask composition was prepared by the same method as embodiment example 1 except that the polymer obtained using the synthesis described in synthesis example 7 was used instead of the polymer of synthesis example 1.

Embodiment Example 8

A hard mask composition was prepared by the same method as embodiment example 1 except that the polymer obtained using the synthesis described in synthesis example 8 was used instead of the polymer of synthesis example 1.

Embodiment Example 9

A hard mask composition was prepared by the same method as embodiment example 1 except that the polymer obtained using the synthesis described in synthesis example 9 was used instead of the polymer of synthesis example 1.

Embodiment Example 10

A hard mask composition was prepared by the same method as embodiment example 1 except that the polymer obtained using the synthesis described in synthesis example 10 was used instead of the polymer of synthesis example 1.

Comparison Example 1

A hard mask composition was prepared by the same method as embodiment example 1 except that the polymer obtained using the synthesis described in comparison synthesis example 1 was used instead of the polymer of synthesis example 1.

Comparison Example 2

A hard mask composition was prepared by the same method as embodiment example 1 except that the polymer obtained using the synthesis described in comparison synthesis example 2 was used instead of the polymer of synthesis example 1.

Gap-Fill Characteristic and Planarization Characteristic

Figure 2:
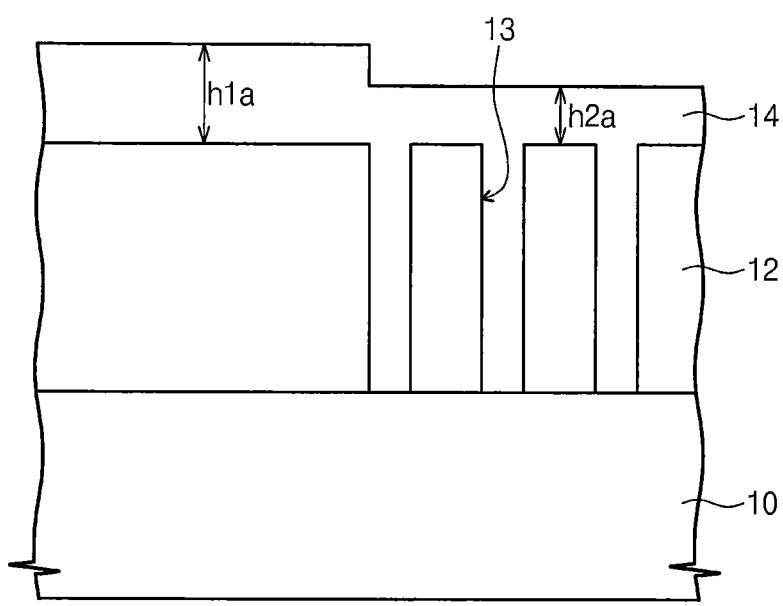
FIG. 2 is a cross-sectional view illustrating a mold layer and hard mask layer according to example embodiments of the present inventive concepts.

As illustrated in FIG. 2, a mold layer 12 having a plurality of openings 13 was formed on a substrate 10, and the hard mask composition of each of the embodiment examples 1 to 10 and comparison examples 1 and 2 was coated on the mold layer 12 using a spin-on-coating method. Thereafter, the coated hard mask composition was baked at 240° C. for 60 seconds to form a hard mask layer 14. Next, the gap-fill and planarization characteristics of the hard mask layers 14 were observed using a scanning electron microscope (SEM).

The gap-fill characteristic was confirmed by verifying whether a void occurred in a cross-section of the hard mask layer 14 or not. Here, the cross-section of the hard mask layer 14 was observed by the SEM. The planarization characteristic was confirmed by calculating a flat degree (p) using a height different of a top surface of the hard mask layer 14. Here, the flat degree p may be calculated by the following equation.

$$\text{Flat degree } (p) = (1 - h2a/h1a) * 100$$

As a difference between h1a and h2a is reduced, the planarization characteristic may become better. In other words, as the value of flat degree (p) decreases, the planarization characteristic may become improved.

The results of the gap-fill and planarization characteristics are shown in the following Table 1.

TABLE 1

| Classification | Gap-fill characteristic | Planarization characteristic (Flat degree) |
|---|---|---|
| Embodiment example 1 | No void | 21.2 |
| Embodiment example 2 | No void | 10.5 |
| Embodiment example 3 | No void | 18.5 |
| Embodiment example 4 | No void | 16.4 |
| Embodiment example 5 | No void | 25.5 |
| Embodiment example 6 | No void | 7.2 |
| Embodiment example 7 | No void | 10.0 |
| Embodiment example 8 | No void | 12.5 |
| Embodiment example 9 | No void | 11.3 |
| Embodiment example 10 | No void | 26.7 |
| Comparison example 1 | Occurrence of void | 29.7 |
| Comparison example 2 | Occurrence of void | 32.0 |

Referring to Table 1, it is confirmed that the hard mask layers 14 including the hard mask compositions of embodiment examples 1 to 10 have excellent planarization characteristics as compared with the hard mask layers 14 including the hard mask compositions of comparison examples 1 and 2. In addition, voids were observed in comparison examples 1 and 2, but a void was not observed in embodiment examples 1 to 10. In other words, it is confirmed that the gap-fill characteristics of embodiment examples 1 to 10 are better than those of comparison examples 1 and 2.

According to embodiments of the present inventive concepts, the polymer for the hard mask may include at least one heteroatom selected from the group consisting of nitrogen, oxygen, and sulfur and at least two aromatic rings combined with and/or bound to the at least one heteroatom, so the polymer may have a flexible three-dimensional structure. Thus, the fluidity and heat-resistance of the polymer for the hard mask may be improved. In addition, the polymer may include at least one benzene group or polycyclic aromatic group bonded to its substituent, so the mechanical characteristic of the polymer for the hard mask may be improved. As a result, the hard mask composition including the polymer may have excellent gap-fill and planarization characteristics.

The foregoing is illustrative of the present inventive concepts and is not to be construed as limiting thereof. Although example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A polymer comprising a structure represented by chemical formula 3:

[Chemical formula 3]

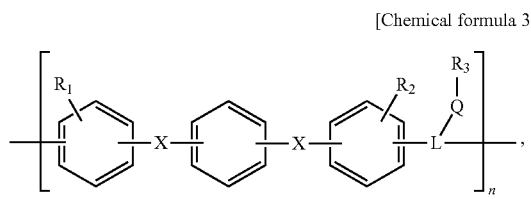

wherein X is selected from the group consisting of O, S, and NH;
Q is a benzene group or a substituted or unsubstituted polycyclic aromatic group;
L is a C1 to C20 alkylene group;
$R_1$ and $R_2$ are each independently attached to one of the at least two aromatic rings and are each independently selected from the group consisting of hydrogen, a hydroxyl group, an amino group, and a substituted or unsubstituted C1 to C30 alkoxy group;
$R_3$ is hydrogen, a hydroxyl group, or a substituted or unsubstituted C1 to C30 alkoxy group; and
n is a natural number from 1 to 10.

2. The polymer of claim 1, wherein the polymer comprises a structure represented by chemical formula 3a:

[Chemical formula 3a]

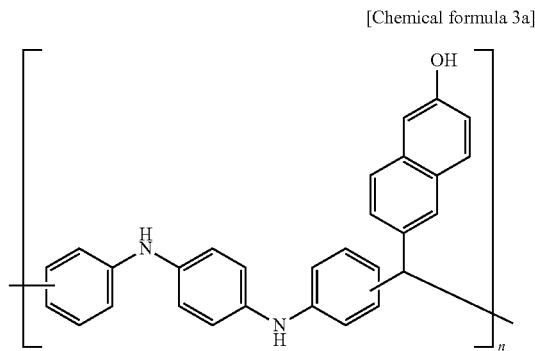

wherein n in the chemical formula 3a is a natural number from 1 to 10.

3. The polymer of claim 1, wherein the substituted or unsubstituted polycyclic aromatic group includes a naphthalene group, an anthracene group, a pyrene group, or any combination thereof.

4. The polymer of claim 1, wherein the polymer has a weight-average molecular weight of 1,000 to 10,000.

5. The polymer of claim 1, wherein the polymer comprises a structure represented by chemical formula 3b:

[Chemical formula 3b]

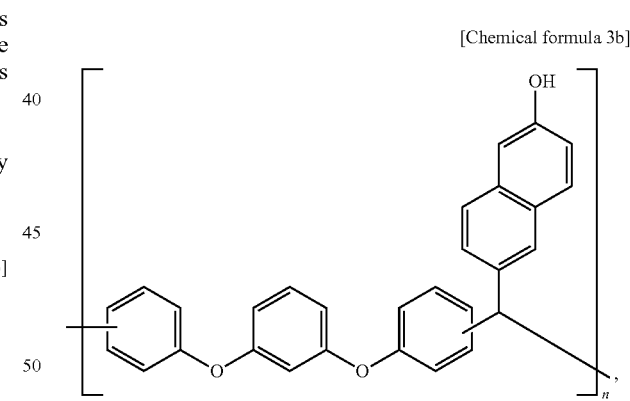

wherein n in the chemical formulas 3a and 3b is a natural number from 1 to 10.

6. A hard mask composition comprising:

an organic solvent; and the polymer of claim 1.

7. The hard mask composition of claim 6, wherein the polymer includes a structure represented by chemical formula 3a:

[Chemical formula 3a]

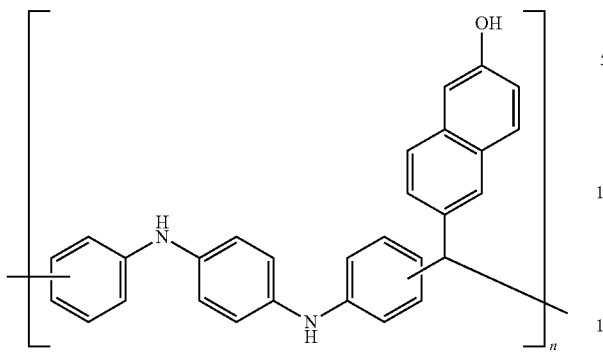

wherein n in chemical formula 3a is a natural number from 1 to 10.

8. The hard mask composition of claim 6, wherein the substituted or unsubstituted polycyclic aromatic group includes a naphthalene group, an anthracene group, a pyrene group, or any combination thereof.

9. The hard mask composition of claim 6, wherein the polymer is present in the hard mask composition in an amount in a range of about 2 wt % to about 20 wt % with respect to a total content of the hard mask composition.

10. The hard mask composition of claim 6, wherein the organic solvent includes at least one of a glycol ether-based solvent, an acetate-based solvent, a ketone-based solvent, a hydroxypropionate-based solvent, a cabitol-based solvent, or a lactate or lactone-based solvent.

11. The hard mask composition of claim 6, wherein the polymer comprises a structure represented by chemical formula 3b:

[Chemical formula 3b]

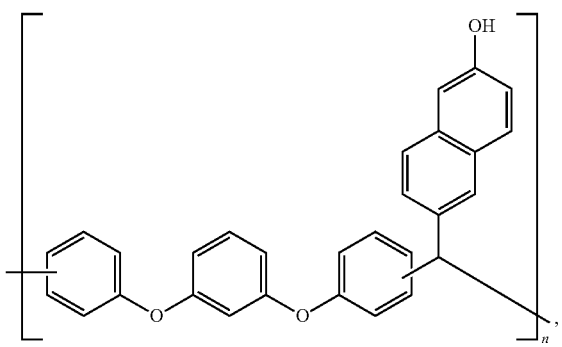

wherein n in the chemical formula 3b is a natural number from 1 to 10.

12. A method for forming a pattern of a semiconductor device, the method comprising:
forming a lower layer on a substrate;
forming a hard mask layer on the lower layer using the polymer of claim 1; and
patterning the hard mask layer to form a hard mask pattern,
wherein the patterning of the hard mask layer comprises:
forming photoresist patterns on the hard mask layer; and
etching the hard mask layer using the photoresist patterns as etch masks.

13. The method of claim 12, wherein forming the hard mask layer comprises:
coating the hard mask composition on the lower layer using a spin-on-coating method; and
performing a bake process on the coated hard mask composition.

14. A polymer comprising a structure represented by chemical formula 2d:

[Chemical formula 2d]

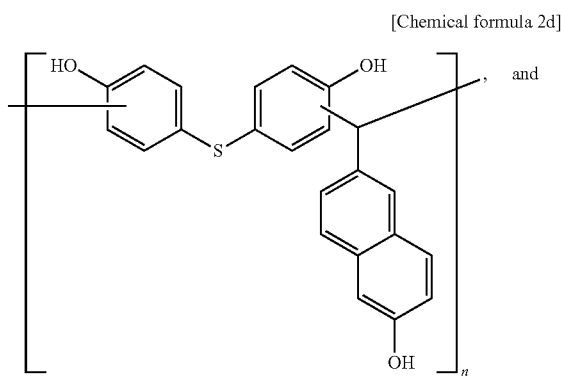

wherein n is a natural number from 1 to 10.

15. A hard mask composition comprising:
an organic solvent; and
the polymer of claim 14.

16. A method for forming a pattern of a semiconductor device, the method comprising:
forming a lower layer on a substrate;
forming a hard mask layer on the lower layer using the polymer of claim 14; and
patterning the hard mask layer to form a hard mask pattern,
wherein the patterning of the hard mask layer comprises:
forming photoresist patterns on the hard mask layer; and
etching the hard mask layer using the photoresist patterns as etch masks.

17. A polymer comprising a structure represented by one or more of chemical formulas 4b and 4c:

[Chemical formula 4b]

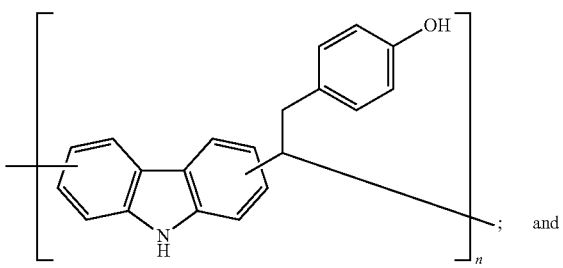

-continued

[Chemical formula 4c]

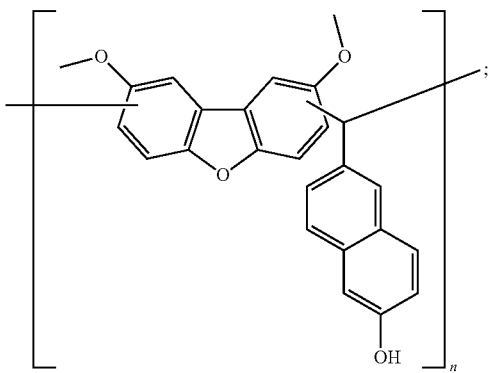

wherein n in chemical formulas 4b and 4c is a natural number from 1 to 10.

18. A hard mask composition comprising:
    an organic solvent; and
    the polymer of claim 17.

19. A method for forming a pattern of a semiconductor device, the method comprising:
    forming a lower layer on a substrate;
    forming a hard mask layer on the lower layer using the polymer of claim 17; and
    patterning the hard mask layer to form a hard mask pattern,
    wherein the patterning of the hard mask layer comprises:
    forming photoresist patterns on the hard mask layer; and
    etching the hard mask layer using the photoresist patterns as etch masks.

* * * * *